United States Patent [19]

Kadomura et al.

[11] Patent Number: 5,981,913

[45] Date of Patent: Nov. 9, 1999

[54] STATIC ELECTRICITY CHUCK AND WAFER STAGE

[75] Inventors: Shingo Kadomura; Tomohide Jozaki; Shinsuke Hirano; Kinya Miyashita, all of Kanagawa; Seiichirou Miyata, Yamaguchi; Yoshiaki Tatsumi, Kanagawa, all of Japan

[73] Assignee: Sony Corporation, Tokyo, Japan

[21] Appl. No.: 08/821,334

[22] Filed: Mar. 20, 1997

[30] Foreign Application Priority Data

Mar. 22, 1996 [JP] Japan ..................... 8-065625

[51] Int. Cl.⁶ ............... H05B 3/68; C23C 16/00; B23B 5/22
[52] U.S. Cl. .................. 219/444.1; 118/724; 279/128
[58] Field of Search .................. 219/443, 457, 219/464, 544; 279/128, 134; 361/234; 269/8; 118/724–725

[56] References Cited

U.S. PATENT DOCUMENTS

| | | | |
|---|---|---|---|
| 5,151,845 | 9/1992 | Watanabe et al. | 361/234 |
| 5,166,856 | 11/1992 | Liporace et al. | 361/233 |
| 5,191,506 | 3/1993 | Logan et al. | 361/234 |
| 5,280,156 | 1/1994 | Niori et al. | 361/234 |
| 5,374,807 | 12/1994 | Yahav et al. | 219/464 |
| 5,663,865 | 9/1997 | Kawada et al. | 361/234 |

Primary Examiner—Teresa Walberg
Assistant Examiner—Sam Paik
Attorney, Agent, or Firm—Hill & Simpson

[57] ABSTRACT

There are provided a static electricity chuck which can vary the temperature of a wafer in a short time without adversely effecting throughput, and a wafer stage having the static electricity chuck. The static electricity chuck includes a dielectric member 4 formed of insulating material, an electrode 5 of conductor which is disposed at the lower side of the dielectric member 4, and a heater 6 which is disposed at the lower side of the electrode 5 and heats the dielectric member 4. The wafer stage 1 includes the static electricity chuck which is provided on a metal jacket having cooling apparatus.

9 Claims, 3 Drawing Sheets

STATIC ELECTRICITY CHUCK AND WAFER STAGE

BACKGROUND OF THE INVENTION

1. Field of the Invention

The present invention relates to a static electricity chuck which is used to adsorptively hold a wafer in a manufacturing apparatus for a semiconductor device such as an etching device or the like, and a wafer stage having the static electricity chuck.

2. Description of Related Art

Recently, a technical requirement for the micromachining in a super LSI technique has been increasingly severer. For example, with respect to an etching treatment, it is indispensable to use a treatment method which can achieve both a high-precision micromachining which suppress a dimensional conversion difference as much as possible, and a high selection ratio to a back layer.

It is well known that when materials other than oxide film are subjected to a plasma etching treatment, a so-called side wall protection film is used to ensure an anisotropic shape. That is, when reaction products generated during the plasma etching treatment are re-dissociated in plasma, and these re-dissociated materials are deposited as various kinds of deposits such as organic polymer, etc. on the side walls of a pattern to thereby form a side wall protection film. The side wall protection film thus formed serves to protect the side walls from being etched.

As described above, the side wall protection film is formed by the deposits which are generated from the reaction products. Therefore, when a pattern formed by an etching treatment is convex, the thickness of the side wall protection wall is relatively larger as the width of the pattern is finer, and thus the whole pattern width is liable to be still smaller than a desired width. Accordingly, as described above, the fineness of each pattern is promoted, and if the pattern width is small (narrow), the dimensional precision of the pattern thus obtained is reduced when the anisotropy of the etching is achieved by using the side wall protection film.

In order to solve the above disadvantage, a technique of performing an etching treatment while exhausting at high speed has been recently attempted and considered to ensure the dimensional precision. In this high-speed exhausting process, a pump having a higher exhausting speed than a conventional etching treatment apparatus is secured, and the conductance of etching gas is improved to shorten the residence time of the etching gas during the etching treatment, whereby the re-dissociation of reaction products in plasma is suppressed during the etching treatment. According to the high-speed exhausting process as described above, the amount of deposits which are generated by the re-dissociation of the reaction products can be greatly reduced, so that the absolute value of the dimensional conversion difference and the dispersion thereof can be remarkably suppressed.

However, in the high-speed exhausting process as described above, the reaction products are quickly exhausted, resulting in reduction of a supply source for forming a side wall protection film. Therefore, a side wall protection film is not formed at a sufficient thickness, and the anisotropic shape is not sufficiently ensured. Accordingly, there occurs a new problem that the precision in shape of a pattern obtained when an overetching is carried out is lowered.

That is, when a substrate-applied bias is lowered to ensure the selection ratio to the back layer in the overetching process, occurrence of side etching or notching is unavoidable because the side wall protection film is thin and thus weak. On the other hand, when the applying bias is increased to ensure the shape precision, the selection ratio to the back layer is lowered.

In view of the foregoing, a low-temperature etching technique for cooling a wafer so that the temperature of the water is reduced to zero degree or less in the etching treatment is proposed as a technique which can solve the trade-off problem between the selection ratio and the shape precision as described above and achieve both the selection ratio and the anisotropic shape. This low-temperature etching technique is proposed by K. Tsujimoto, et al. in "Proceedings of Symposium on Dry Process" pp 42–49 on 24th and 25th of Oct. 1988 in Tokyo.

According to this technique, radical reaction is suppressed by reducing the temperature of samples to keep the anisotropy even under a low substrate-applied bias.

However, this low-temperature etching technique has the following disadvantages.

First, it is difficult to process those materials like W polyside for which reaction products have different vaporization pressures. If the temperature of samples are reduced to a low temperature suitable for etching of polysilicon to etch W polyside because reaction products such as $WCl_x$, $WO_xCl_y$, etc. which are generated by the etching treatment of $WSi_x$ have low vaporization pressure, it would be impossible to perform the etching of $WSi_x$.

Secondly, $\Delta T$ (the difference between a set temperature of a sample stand and wafer temperature) increases during the etching treatment That is, for example, in a contact hole processing work, the setting of the low temperature is effective to ensure the selection ratio to the back layer of Si, however, the low-temperature setting induces the contact hole to be tapered in shape due to excessive deposition of polymer. Therefore, as described above, it is difficult to set the low-temperature condition, and incident energy must be increased to dissociate Si—O bonds in the contact hole processing work, resulting in increase of $\Delta T$.

Accordingly, in the low-temperature etching treatment as described above, the etching must be performed at an incompletely low temperature.

In order to solve this disadvantage, it may be considered that the set temperature of a sample such as wafer or the like is varied between materials whose reaction products are different in vaporization pressure, or between an just etching treatment and an over etching treatment. However, if the set temperature is varied in the midst of the etching treatment, the throughput would be reduced, and it is inconvenient on cost.

Accordingly, there has been required a mechanism which can vary the temperature of a wafer in short time with no effect on the throughput, that is, which enables quick temperature reduction and increase.

OBJECT AND SUMMARY OF THE INVENTION

An object of the present invention is to provide a static electricity chuck which can vary the temperature of a wafer in short time without adversely effecting throughput, and a wafer stage for the static electricity chuck.

In order to attain the above object, according to a first aspect of the present invention, a static electricity chuck comprises a dielectric member formed of insulating material, an electrode which is disposed below the dielectric member and formed of electric conductor, and a heater which is disposed below the electrode and adapted to heat the dielectric member.

According to the static electricity chuck as described above, the static electricity chuck and the heater is unified into one body, the heat of the heater is quickly transferred through the electrode to the dielectric member, and thus a wafer which is mounted and held on the dielectric member is quickly heated.

The electrode may be formed of a soldering layer which is used to fix the dielectric member. In this case, the dielectric member and the electrode can be surely joined to each other, and the electrode can be formed at a small thickness. In addition, since the electrode is formed of soldering material, that is, metal or alloy having high heat conductivity, the heat conduction from the heater to the dielectric member is performed more quickly.

Sintered material may be directly used as the dielectric member, or the dielectric member may be formed by a thermal spraying method. In this case, the degree of freedom in manufacturing is high, and the cost is low. With respect to the shape of the dielectric member, it may be designed to have a disc portion which forms an adsorbing face for the wafer, and a cylinder portion which extends from the side peripheral edge downwardly. In this case, if the cylinder portion is disposed to cover the side peripheral portion of the electrode, occurrence of a leak current on the side surface of the electrode due to plasma can be prevented, for example, when the static electricity chuck is used for the plasma treatment of the plasma treatment apparatus.

With respect to the mount of the heater on the electrode, the heater may be mounted through an insulating member having high thermal conductivity on the electrode. In this case, aluminum nitride is most suitably used as the insulating member. The interposition of the insulating member between the electrode and the heater prevents current flow from the electrode to the heater, and the delay of thermal conduction from the heater due to the insulating member can be prevented because the insulating member has high thermal conductivity (for example, the thermal conductivity of aluminum nitride is equal to 0.235 [cal/cm.sec.°C.].

The heater may be designed in a thin film type. In this case, a metal plate is preferably provided between the insulating member and the heater or below the heater. The provision of the metal plate keeps sufficient mechanical strength for the whole static electricity chuck irrespective of the thin-film design of the heater. Further, if the metal plate is provided above the heater, it serves as a heat transfer plate for quickly transferring the heat from the heater to the insulating plate. On the other hand, if the metal plate is provided below the heater, the metal plate serves as a heat transfer plate for transferring cool heat from a metal jacket or the like to the heater side.

Particularly when the heater is designed not only in a thin film structure, but also in a spiral shape, the whole mechanical strength of the heater is reduced, and the heat conductivity thereof is also reduced. However, as described above, the reduction of these physical properties can be compensated by providing the metal plate. Further, when the insulating member is formed of aluminum nitride, it is preferable that the metal plate is formed of molybdenum having high heat conductivity of 0.37 [cal/cm.sec.°C.] because the metal plate sufficiently functions as the heat transfer plate as described above. Further, Molybdenum has a linear expansion coefficient of $5.7 \times 10^{-6}$/°C. which is near to the linear expansion coefficient of ceramics (for example, aluminum nitride has a linear expansion coefficient of $5.1 \times 10^{-6}$/°C.). Therefore, if molybdenum is used for the metal plate, even when the metal plate suffers a thermal stress due to application of repetitive cycle of cooling and heating, the insulating member and the dielectric member disposed on the insulating member can be prevented from being cracked or exfoliated due to the thermal stress.

The insulating member may be designed to have a cylinder portion which extends from the side peripheral edge thereof downwardly, and the heater may be disposed inside the cylinder portion. In this case, the side surfaces of the heater can be surely covered by the cylinder portion. Therefore, when the static electricity chuck is used in a plasma treatment by a plasma treatment apparatus, occurrence of a leak current on the side surfaces of the heater due to plasma can be prevented. Further, if a flange portion is formed in the cylinder portion so as to extend outwardly from the lower end edge of the cylinder portion, the insulating member is mechanically reinforced by the flange portion.

Further, according to a second aspect of the present invention, a wafer stage is characterized in that a static electricity chuck comprising a dielectric member formed of insulating material, an electrode which is disposed below the dielectric member and formed of conductor, and a heater which is disposed below the electrode and adapted to heat the dielectric member, are provided on a metal jacket having cooling means.

According to the wafer stage, the static electricity chuck according to the first aspect of the present invention is provided on the metal jacket having the cooling means. Therefore, not only the wafer can be quickly heated by the heater provided to the static electricity chuck, but also the wafer can be cooled through the static electricity chuck by the metal jacket.

As described above, according to the static electricity chuck of the present invention, the heater and the static electricity chuck are unified into one body, whereby the heat of the heater is quickly transferred through the electrode to the dielectric member and thus the wafer which is mounted and held on the dielectric member is quickly heated. Accordingly, for example, when the static electricity chuck is applied to an etching apparatus, a temperature switching operation from a low temperature to a high temperature can be performed in short time.

Further, according to the wafer stage of the present invention, the static electricity chuck is provided on the metal jacket having the cooling means. Therefore, not only the heating, but also cooling can be quickly performed, so that the switching operation of the wafer temperature can be performed in short time. Accordingly, as compared with a conventional etching process which carries out an etching treatment sequentially at plural times while varying the wafer temperature, the etching treatment of the present invention can be performed without adversely effecting the throughput while using the advantage of the low-temperature etching treatment more effectively.

DETAILED DESCRIPTION OF PREFERRED EMBODIMENTS

Preferred embodiments according to the present invention will be described hereunder with reference to the accompanying drawings.

Figure 1:
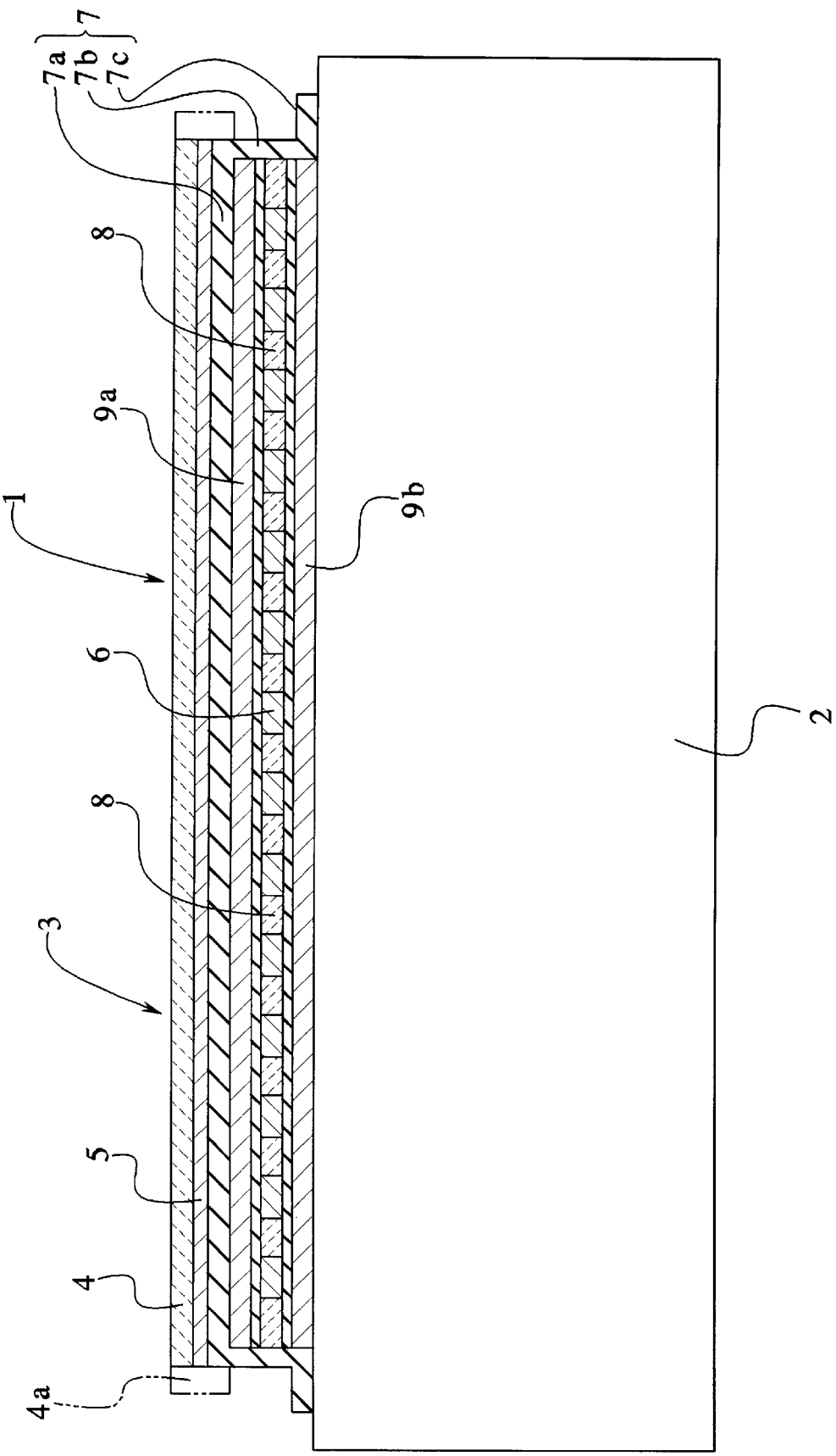
FIG. 1 is a diagram showing the construction of a wafer stage of the present invention, in which only a static electricity chuck is illustrated as a cross-sectional view.

FIG. 1 shows an embodiment of a wafer stage according to the present invention. In FIG. 1, reference numeral 1 represents a wafer stage. The wafer stage 1 is constructed so that a static electricity chuck 3 of an embodiment of the present invention is fixedly mounted on a metal jacket 2.

The metal jacket 2 is designed to have cooling means (not shown) as described above, and it serves to transfer cool heat from the cooling means to the static electricity chuck 3 disposed on the metal jacket 2.

The static electricity chuck 3 is designed in a substantially cylindrical (disc) shape and comprises a dielectric member 4 formed of insulating material, an electrode 5 which is disposed below the lower surface of the dielectric member 4, a heater 6 disposed below the electrode 5, and an insulator 7 interposed between the electrode 5 and the heater 6. The dielectric member 4 comprises a disc-shaped ceramic plate having about 0.2 mm in thickness, which is formed of insulating material having high thermal conductivity such as sapphire (thermal conductivity: 0.1 [cal/cm.sec.°C.]) or alumina (thermal conductivity: 0.05 [cal/cm.sec°C.]). In this embodiment, the dielectric member 4 comprises a sintered member which is formed in advance.

Any material may be used for the electrode 5 insofar as it is formed of conductor such as metal or alloy. In this embodiment, the electrode 5 is formed of a soldering layer for fixing the dielectric member 4 on the insulator 7, that is, a soldering material of about 0.5 mm in thickness which is provided between the insulator 7 and the dielectric member 4. Specifically, an alloy which is formed of titanium, tin, antimony and magnesium is used as the soldering material. The electrode 5 is connected through a wire to a high voltage source (as not shown in FIG. 1). By applying a DC voltage to the electrode 5, the dielectric 4 has an absorptive force.

The insulator 7 comprise a disc portion 7a which is brought into contact with the electrode 5, that is, the soldering layer, a cylinder portion 7b which extends downwardly from the side peripheral edge of the disc portion 7a, and a flange portion 7c which extends outwardly from the lower end edge of the cylinder portion 7b, and it is formed of an insulating material having high thermal conductivity at a thickness of about 2 mm as a whole. As the insulating material may be used aluminum nitride (AlN) (thermal conductivity: 0.235 [cal/cm.sec.°C.]). In this embodiment, the insulator 7 is formed of aluminum nitride.

In this embodiment, the heater 6 is formed of an Fe—Cr-5%Al–0.5%Y alloy, and it has a spiral form in a plan view. Further, the heater 6 is formed as a thin film of about 0.1 mm in thickness and about 2 to 3 mm in width. As not shown, the heater 6 is connected through a wire to a power source, and the heater 6 generates heat of about 2 kW.

The heater 6 is provided with an insulating member 8 so that the insulating member 8 is embedded in the gap of the spiral heater pattern, and with this structure, the heater 6 forms a disc shape while reinforced by the insulating member 8. In this embodiment, aluminum nitride is used as the insulating member 8.

The disc member comprising the heater 6 and the insulating member 8 is attached to a metal plate 9a on the upper surface thereof and to a metal plate 9b on the lower surface thereof. The heater 6 which is sandwiched between the metal plates 9a and 9b as described above is hermetically accommodated in the cylinder portion 7b of the insulator 7. Metal or alloy having high thermal conductivity is preferably used for the metal plates 9a and 9b in order to quickly transfer the heat of the heater 6 to the dielectric member 4 or quickly transfer the cool heat from the metal jacket 2 to the heater 6. In this embodiment, a molybdenum plate of about 2 mm in thickness is used. Further, insulating coating as shown in FIG. 1 of oxide film or the like is provided on the inner surfaces of the metal plates 9a and 9b, thereby preventing current flow from the heater 6 to the metal plates 9a and 9b. The metal plate 9a is joined to the dielectric member 7 by soldering, and the metal plate 9b is joined to the metal jacket 2 by soldering. Here, like the soldering material serving as the electrode 5, alloy which is formed of titanium tin, antimony and magnesium is used as the soldering material for the metal plates 9a and 9b.

In the static electricity chuck 3, the gap between the dielectric member 4 and the insulator 7 is covered by insulator of resin or the like (not shown) so that the electrode 5 formed of the soldering layer is prevented from being exposed to the outside at the side peripheral edge thereof. If the side peripheral edge of the electrode 5 is covered by the insulator (not shown) as described above, there can be prevented occurrence of leak current at the side peripheral edge of the electrode 5 due to plasma even when the static electricity chuck 3 is used for the plasma treatment in the plasma treatment apparatus.

In the static electricity chuck 3 is embedded a pusher pin (not shown) for pushing up the wafer which is mounted and held on the dielectric member 4, and the pusher pin is connected to a retracting mechanism (not shown) for projecting the pusher pin from the surface of the dielectric member 4 into the outside and embedding the pusher pin into the dielectric member 4.

Figure 2:
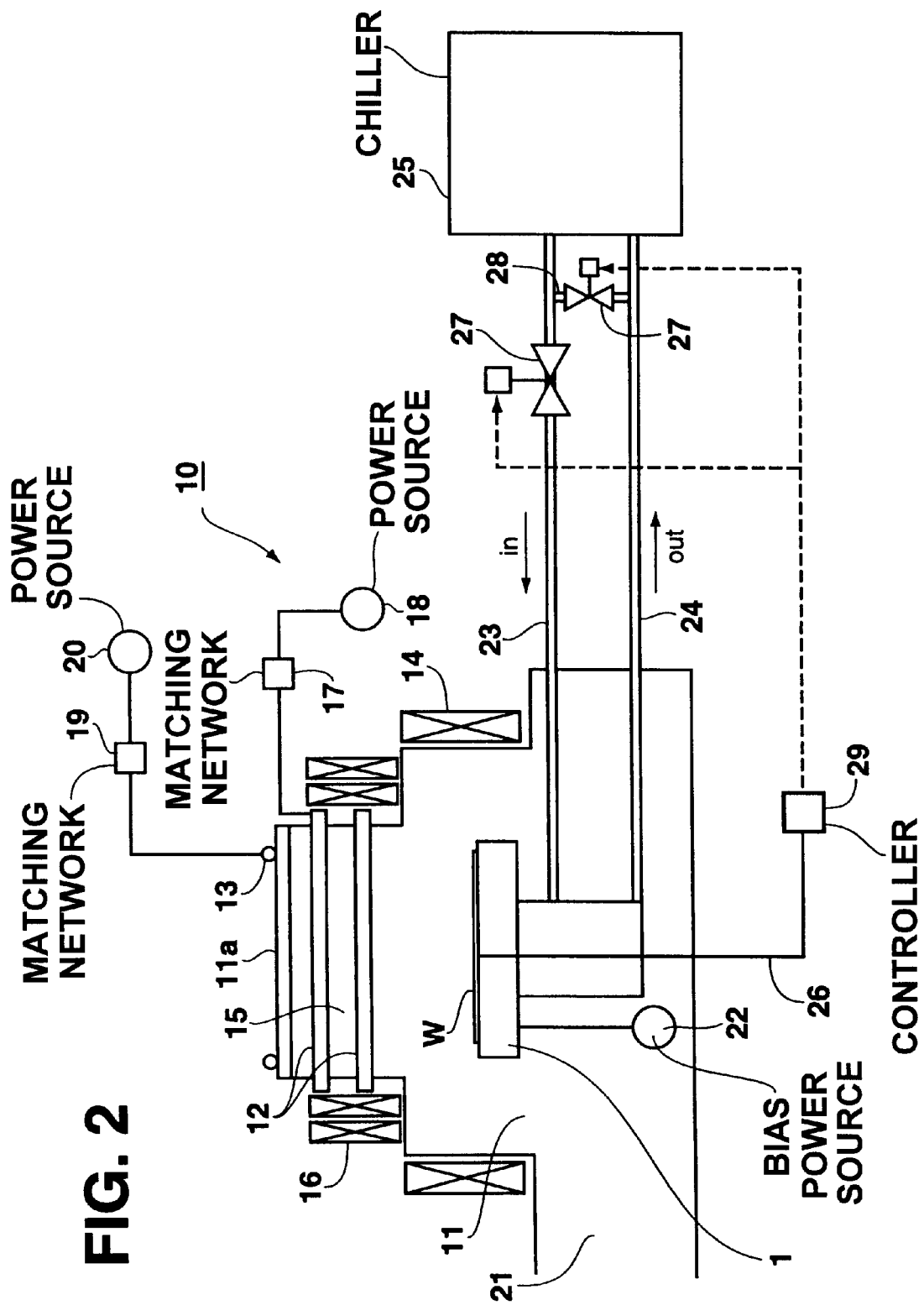
FIG. 2 is a diagram showing the construction of an etching apparatus using the wafer stage shown in FIG. 1.

Next, a method of using the wafer stage 1 having the static electricity chuck 3 will be described on the basis of the case where the wafer stage 1 of this embodiment is used in a plasma etching apparatus 10 shown in FIG. 2.

First, the plasma etching apparatus (hereinafter referred to as "etching apparatus") 10 will be described. The plasma etching apparatus 10 is designed to have a helicon-wave plasma generating source in which two RF antennas are disposed, and a stage which is movable upwardly and downwardly. Specifically, the plasma etching apparatus 10 comprises a diffusion chamber 11, RF antennas 12 which are disposed at the upper side of the diffusion chamber 11, an RF antenna 13 which is disposed in a loop form on a top plate 11a of the diffusion chamber 11, a multipole magnet 14 which is disposed at the outside of the lower portion of the diffusion chamber 11 and adapted to form Cusp magnetic field for suppressing extinction of electrons on the wall of the stage. Each of the RF antennas 12 is provided so as to surround a belljar comprising a cylindrical quartz tube which has a diameter of 350 mm and is formed at the upper portion of the diffusion chamber 12. The RF antennas 12 are designed so that plasma of M=1 mode stands. Further, a solenoid coil assembly 16 which comprises an inner peripheral coil and an outer peripheral coil is disposed at the outside of these antennas 12. The inner peripheral coil of the solenoid coil assembly 16 contributes to propagation of Helicon wave, and the outer peripheral coil contributes to transport of the generated plasma. The RF antennas 12 are connected to a power source 18 through a matching network 17, and the RF antenna 13 is connected to a power source 20 through a matching network 19.

The wafer stage 1 for supporting and fixing a wafer W serving as a sample is provided in the diffusion chamber 11, and an exhaust port 21 for exhausting gas in the diffusion chamber 11 is formed in the diffusion chamber 11 and intercommunicates with a negative pressure means (not shown) such as a vacuum pump or the like. The wafer stage 1 is connected to a bias power source 22 for controlling the energy of incident ions to the wafer W.

The metal jacket 2 of the wafer stage 1 is connected to a chiller 25 through refrigerant pipes 23 and 24, and further connected to a fluorescent fiber thermometer 26 for detecting the temperature of the wafer W. The chiller 25 supplies the metal jacket 2 of the wafer stage 1 through the refrigerant pipe 22 with gas refrigerant which is formed of He gas or the like and whose temperature is set to 100° C. or less, and receives refrigerant which is returned from the metal jacket 2 through the refrigerant pipe 22 to further cool the refrigerant to a predetermined temperature. Accordingly, the wafer W which is held and fixed on the wafer stage 1 is cooled by circulating the gas refrigerant. That is, the cooling means of the present invention is constructed by the chiller 25, the refrigerant pipes 23 and 24 and the gas refrigerant which is circulated from the chiller 25 to the metal jacket 2.

An electrical control valve 27 which can operated at an extremely low temperature is disposed in the refrigerant pipe 23 connected to the chiller 25, and an electrical control valve 27 which can operate at an extremely low temperature is disposed in a bypass pipe 28 between the refrigerant pipes 23 and 24.

Here, the cooling level of the wafer W is controlled by the flow amount of the refrigerant which is supplied from the chiller 25. That is, in order to cool the metal jacket of the wafer stage 1 so that the temperature of the wafer W is reduced to a desired temperature, the temperature which is detected by the fluorescent fiber thermometer 26 is detected by a controller (PID controller) 29, and on the basis of the detected temperature and a preset temperature of the wafer W, the controller 29 controls the opening/closing degree of the electric control valves 27 so as to obtain a gas refrigerant flow amount which is predetermined by experiments and calculations. In FIG. 2, the detailed construction of an etching gas inlet port, a gate valve, etc. is omitted from the illustration.

Figure 3A:
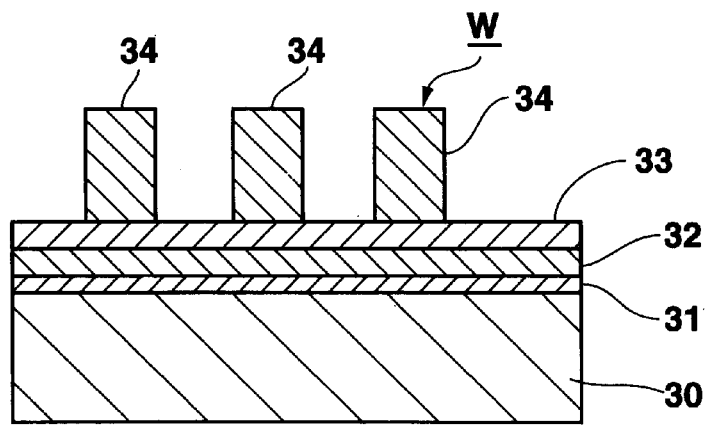
FIGS. 3A to 3C are cross-sectional views showing a series of a dry etching treatment method using the etching apparatus shown in FIG. 2 in a step order.

Next, a dry etching treatment method using the etching apparatus 1 will be described with reference to FIGS. 3A to 3C.

According to this treatment method, W polyside is processed by a two-step etching treatment. That is, in this embodiment, W polyside comprising a polysilicon layer 32 and a $WSi_x$ layer 33 is formed on an $SiO_2$ film 31 on a silicon substrate 30 as shown in FIG. 3A, and further a photoresist pattern 34 is formed on the W polyside. Thereafter, the W polyside of the wafer W is subjected to the etching treatment through the photoresist pattern 34 to process the W polyside in the pattern corresponding to the photoresist pattern 34. In a first step, a main etching is performed at a temperature which is slightly higher than the normal temperature, and in a subsequent second step, an over etching is performed at a low temperature.

Figure 3B:
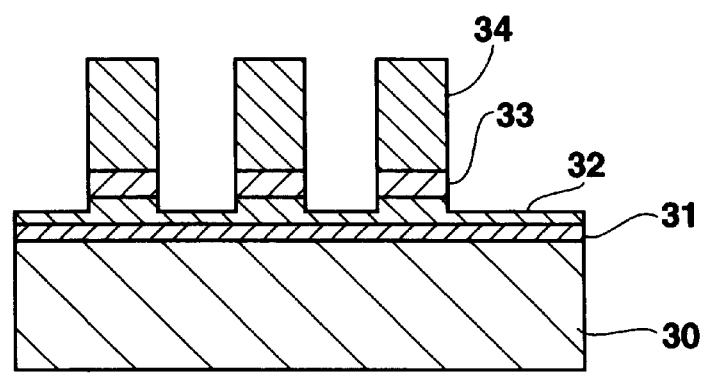

First, the main etching of the first step is performed under the following condition at a high temperature (50 degrees) which is slightly higher than the normal temperature so that the $WSi_x$ layer 33 and the polysilicon layer 32 are etched until a part of the polysilicon layer 32 is left as shown in FIG. 3B.

| First step (main etching) | | |
|---|---|---|
| Etching gas | $Cl_2/O_2$ | 450/50 sccm |
| Pressure | 10 mTorr | |
| Source power | 1500 W | |
| RF bias | 100 W | |
| Wafer stage temperature | 50 degrees | |

With respect to the temperature adjustment of the wafer, the heating operation is performed by the heater 6 of the static electricity chuck 3 provided to the wafer stage 1, the cooling operation is performed by the chiller 25, and the fine adjustment of the wafer temperature is performed by the cooling control of the controller 29 as described above.

Next, in order to perform the overetching treatment of the second step which is subsequent to the first step, the discharging operation of the etching apparatus 10 is temporarily turned out to exhaust the residual gas from the diffusion chamber 11 through the exhaust port 21 to the outside. Etching gas used in the second step (in this embodiment the same gas as the first step is used) as described later is introduced into the diffusion chamber 11, and the gas is stabilized to adjust the pressure in the diffusion chamber 11 to a fixed pressure value. Between the series of operations as described above, that is, immediately after the etching treatment of the first step is finished, the current supply to the heater 6 is stopped, the electric control valve 27 of the bypass pipe 28 in the cooling system using the chiller 25 is fully closed, the electric control valve 27 of the refrigerant pipe 23 is fully opened, and the gas refrigerant below −100 degrees is supplied from the chiller 25 to the metal jacket 2 to quickly cool the wafer W.

By the quick cooling operation, the wafer stage 1 is reduced to −50 degrees (the etching temperature as described later) in short time (about 30 seconds). This is because as described above, in the wafer stage 1 of the present invention, the metal plate 9b of molybdenum having high thermal conductivity is joined to the metal jacket 2 by the soldering, and the metal plate 9a of molybdenum which is provided on the metal plate 9b through the thin-film type heater 6 is joined to the insulator 7 by the soldering, so that the cool heat from the metal jacket 2 is quickly transferred from the metal plate 9b, the heater 6 and the metal plate 9a to the insulator 7. In addition, since the insulator 7 is formed of aluminum nitride having high thermal conductivity, and the electrode 5 is formed of a soldering layer, the cool heat transferred to the insulator 7 is quickly transferred through the insulator 7 and by the electrode 5 to the dielectric member 4.

A series of steps as described above, that is, the sequence of the step of turning out the discharge, the step of exhausting the residual gas in the diffusion chamber 2, the step of introducing new etching gas and the step of stabilizing the gas need a process time which is longer than or equal to the quick cooling. Therefore, the quick cooling operation is not the factor which causes increase of the process time required for the etching treatment of the wafer W.

Figure 3C:
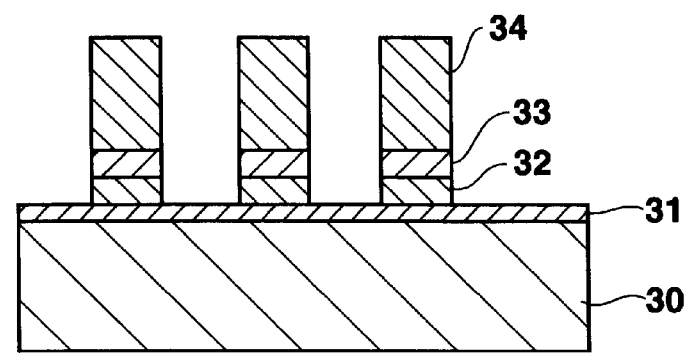

Subsequently, the discharge operation is restarted, and the overetching treatment of the second step at the low temperature (−50 degrees) is performed under the following condition so that a part of the polysilicon layer 32 which is left while exposed from the $SiO_2$ film as shown in FIG. 3C is etched.

| Second step (overetching treatment) | | |
|---|---|---|
| Etching gas | Cl$_2$/O$_2$ | 450/50 sccm |
| Pressure | 10 mTorr | |
| Source power | 1500 W | |
| RF bias | 10 W | |
| Wafer stage temperature | −50 degrees | |

When the overetching treatment is performed under the above condition, the radical reaction can be suppressed due to the low-temperature condition even when the side wall protection film is formed at a small thickness because the etching treatment of this step is performed under the low-temperature cooling condition. Accordingly, the wafer W can be protected from excessive radical attack, and thus even when the bias to be applied to the wafer W is reduced from the 100 W (first step) to 10 W, occurrence of undercut or notching can be suppressed. Therefore, a sufficient anisotropic shape as shown in FIG. 3C can be ensured with keeping the selection ratio of 100 or more to the back layer of SiO$_2$ without adversely effecting the shape even under an overetching treatment of 100%.

As described above, according to the dry etching treatment method using the wafer stage 1 of the present invention, the achievement of both the high selection ratio and the anisotropic shape, that is, the high-precision micromachining can be achieved. In addition, the wafer temperature can be varied easily in short time between respective steps by performing each step with the same etching apparatus 10. Therefore, the wafer temperature can be varied within or approximately in the time which is required for the series of processes (the steps of the discharge, alteration of etching gas, etc. between the steps). Accordingly, the dry etching treatment containing plural steps can be quickly performed without reducing the throughput.

Further, in the case where the same treatment is continuously performed on a new wafer by the same treatment apparatus after the etching treatment of the second step as described above is completed, after the second step is completed and the treated sample is taken out, the temperature of the wafer stage 1 is adjusted to the sample set temperature (the set temperature of the wafer stage) of the initial step (the first step in this embodiment) before a new sample is put into the diffusion chamber 11. That is, in the above embodiment, the sample set temperature is set to −50 degrees in the second step. In place of this method, the wafer stage 1 is quickly heated by the following method. That is, the current is supplied to the heater 6 of the static electricity chuck 3 to heat the whole wafer stage 1 (particularly, the dielectric member 4 side), and the electric control valve 27 of the bypass pipe 28 in the cool system using the chiller 25 is fully opened while the electric control valve 27 of the refrigerant pipe 23 is fully closed, thereby stopping the supply of the gas refrigerant from the chiller 25 to the metal jacket 2.

Accordingly, this method can shorten the time required from the time when the etching treatment on one wafer is finished until the etching treatment on a new sample is started, can be shortened. Particularly, if the temperature of the wafer stage 1 can be reduced to the set temperature within the transport time of the new wafer into the diffusion chamber 11 or in a time near to the transport time, the dry etching treatment comprising plural steps can be performed without reducing the throughput, that is, with keeping sufficient productivity. According to the wafer stage 1 of this embodiment, the heating from −50 degrees to 50 degrees can be performed in short time of about 40 seconds by designing the wafer stage 1 in the structure having excellent thermal conductivity.

Accordingly, according to the wafer stage 1 of the present invention, the quick heating and quick cooling can be performed by both the heater 6 unified to the static electricity chuck 3 and the cooling means of the metal jacket 2. Therefore, the wafer W temperature switching operation can be performed in a short time which is equal to about 30 to 40 seconds, whereby various etching treatments which are performed at different temperature can be substantially continuously performed. Therefore, the advantage of the low-temperature etching treatment can be effectively used.

Further, according to the wafer stage 1 of the present invention, the metal plates 9a and 9b are formed of molybdenum whose linear expansion coefficient ($5.7 \times 10^{-6}$/°C.) is near to the linear expansion coefficient ($5.1 \times 10^{-6}$/°C.) of aluminum nitride which constitutes the insulator. Therefore, even when the wafer stage suffers a thermal stress such as repetition of cooling and heating, the insulator 7 and by the dielectric member 4 disposed on the insulator 7 can be prevented from being cracked or exfoliated due to the thermal stress. Further, both the metal jacket 2 and the metal plate 9b, both the metal plate 9a and the insulator 7, and both the insulator 7 and by the dielectric member 4 are joined to each other by soldering. Therefore, by adjusting the linear expansion coefficient of the soldering material to a value between or near to the linear expansion coefficients of aluminum nitride and molybdenum, the effect of the thermal stress due to the heating/cooling of the wafer stage 1 can be surely suppressed.

In the embodiment as described above, the dielectric member 4 is designed in a disc shape. However, the dielectric member of the present invention is not limited to this shape. For example, as shown by a two-dotted chain line of FIG. 1, the disc-shaped portion may be designed to have a cylinder portion 4a which extends downwardly from the side peripheral edge of the disc-shaped portion such that the side peripheral edge of the electrode 5 is covered by the cylinder portion 4a. In this case, in place of the insulator in the above embodiment, the side peripheral edge of the electrode 5 may be covered by the cylinder portion 4 a. Accordingly, for example, when the static electricity chuck thus constructed is used for the plasma treatment by the plasma treatment apparatus, occurrence of leak current at the side peripheral edge of the electrode 5 due to plasma can be prevented.

What is claimed is:

1. A static electricity chuck, comprising:
   a dielectric member formed of insulating material and having a lower side and a side peripheral edge;
   an electrode which is disposed at the lower side of said dielectric member and formed of conductor, said electrode having a lower side;
   an electrical insulator of a high thermal conductivity on said lower side of said electrode; and
   a heater which is disposed at the lower side of said electrical insulator so that said electrical insulator is between said heater and said electrode and operable to heat said dielectric member;
   said dielectric member having a cylinder portion extending downwardly from the side peripheral edge thereof to a lower end edge and a flange portion extending outwardly from the lower end edge of said cylinder portion, said insulator being of aluminum nitride.

2. The static electricity chuck as claimed in claim 1, wherein said electrode is formed of a soldering layer for fixing said dielectric member.

3. The static electricity chuck as claimed in claim 1, wherein said dielectric member is formed by a thermal spraying method.

4. The static electricity chuck as claimed in claim 1, wherein said heater is designed in a thin-film form, and a metal plate is provided between said heater and said insulator.

5. The static electricity chuck as claimed in claim 1, wherein said heater is designed in a thin-film form, and a metal plate is provided at the lower side of said heater.

6. The static electricity chuck as claimed in claim 1, wherein said insulator has a cylinder portion which extends downwardly from the side peripheral edge thereof, and said heater is disposed inside said cylinder portion.

7. The static electricity chuck as claimed in claim 4, wherein said insulator is formed of aluminum nitride, and said metal plate is formed of molybdenum.

8. The static electricity chuck as claimed in claim 5, wherein said insulator is formed of aluminum nitride, and said metal plate is formed of molybdenum.

9. The static electricity chuck as claimed in claim 1, wherein said dielectric member has a cylinder portion which extends downwardly from the side peripheral edge thereof, and said electrode is covered by said cylinder portion at the side peripheral portion thereof.

\* \* \* \* \*